Figure 1:
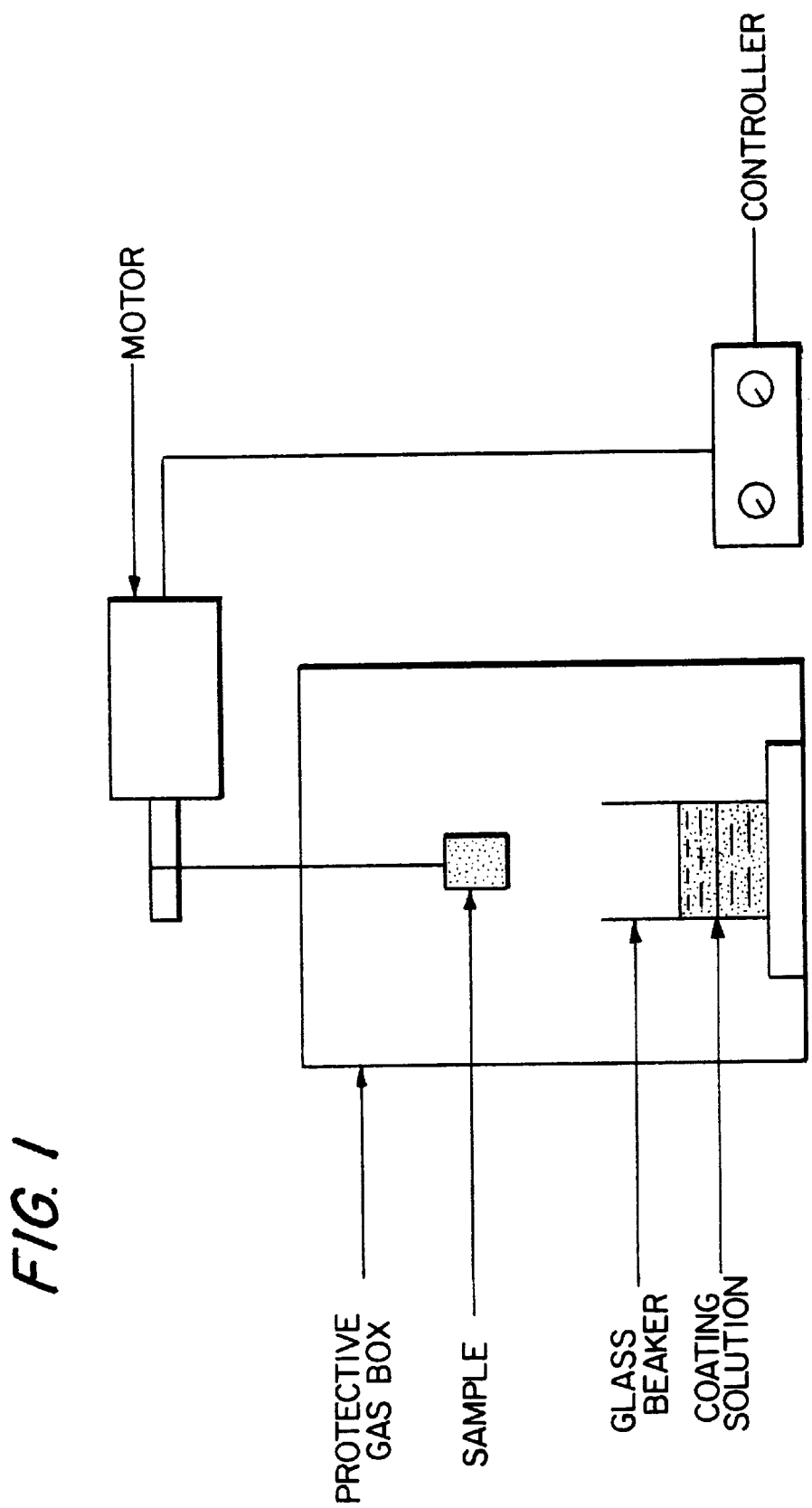

United States Patent [19]
Bill et al.

[11] Patent Number: 6,117,233
[45] Date of Patent: Sep. 12, 2000

[54] FORMATION OF SINGLE-CRYSTAL THIN SIC FILMS

[75] Inventors: Joachim Bill, Ditzingen, Germany; Frederick F. Lange, Santa Barbara, Calif.; Thomas Wagner, Stuttgart, Germany; Fritz Aldinger, Oberaichen, Germany; Detlef Heimann, Stuttgart, Germany

[73] Assignee: Max-Planck-Gesellschaft zur Forderung DE, Munich, Germany

[21] Appl. No.: 08/907,130

[22] Filed: Aug. 6, 1997

Related U.S. Application Data

[63] Continuation of application No. PCT/EP96/00496, Feb. 6, 1996.

[30] Foreign Application Priority Data

Feb. 7, 1995 [DE] Germany .................. 195 03 976

[51] Int. Cl.[7] .................................................. C30B 23/02
[52] U.S. Cl. ........................... 117/84; 117/90; 427/249; 427/255
[58] Field of Search .................... 117/951, 919, 117/925, 928, 3, 60, 68, 19, 937, 41, 78, 932, 58, 21, 90, 95, 106, 84; 427/249, 255

[56] References Cited

U.S. PATENT DOCUMENTS

| | | | |
|---|---|---|---|
| 4,446,169 | 5/1984 | Castle | 427/53.1 |
| 5,139,871 | 8/1992 | Wallace | 428/368 |
| 5,225,032 | 7/1993 | Golecki | 156/612 |
| 5,380,553 | 1/1995 | Loboda | 427/226 |
| 5,393,815 | 2/1995 | Takeda | 524/262 |
| 5,395,648 | 3/1995 | Davis | 117/215 |

OTHER PUBLICATIONS

Carlsson; Cooney (Journal of the American Ceramic Society, "Pyrolysis of Silicon–backbone polymers to SiC". 1990, vol. 73 No. 2 pp. 237–241, Feb. 1990.

Lewis "Direct Observation of Preceramic and Organic binder decomposition in 2–D Model". Journal of American Ceramic Society vol. 77 No. 7 pp. 1839–1845 Jul. 1994.

Kienzleszabo, Riedel Journal of Material Science 28 pp. 3931–3938 1993.

*Primary Examiner*—Felisa Garrett
*Attorney, Agent, or Firm*—Fulbright & Jaworski, LLP.

[57] ABSTRACT

Thin, single-crystal SiC films are obtained by means of a pyrolysis process, the substrate to be coated being covered with a carbonaceous polysilane, the adhering layer being pyrolyzed in an inert atmosphere and the amorphous layer of SiC obtained in this way being crystallized by maintaining it at a temperature of over 700° C. Using a special variation of the process, it is easy to form doped SiC films. To this end the dopant is added in the form of a silane compound.

10 Claims, 1 Drawing Sheet

FORMATION OF SINGLE-CRYSTAL THIN SiC FILMS

This application is a con. of PCT/EP96/00496 filed Feb. 6, 1996.

This invention relates to a process for the formation of single-crystal thin silicon carbide films, which may also contain a doping additive.

Silicon carbide (SiC) is characterized by a combination of useful properties; for example, it has a high melting point, is extremely hard, is highly resistant to chemicals and mechanical damage and, in addition, has useful electronic properties. This material is accordingly regarded as having a lot of technical potential, in particular for electronic applications. There are a number of processes described in the prior art with which thin SiC films can be formed on a suitable substrate, as a rule Si. However, the formation of single-crystal films is relatively complicated and therefore costly.

Liaw and Davis (J. Electrochem. Soc., 132 (1985) 642–648) describe a CVD process for producing single-crystal SiC films which is carried out under atmospheric pressure and at a temperature in the region of at least 1600 K. This process involves first of all applying a buffer layer of carbon to a silicon substrate using $C_2H_4$ and then, using $SiH_4$ and $C_2H_4$ in $H_2$ as carrier gas, forming a single-crystal SiC film.

The formation of polycrystalline and single-crystal 3C—Sic ($\beta$-SiC) films by means of a CVD process is also described by Takahashi et al., (Appl. Phys. Lett., 61, 17 (1992) 2081–2083), Nordell et al., (Applied. Phys. Lett., 64, 13 (1994) 1647–1649) and in the U.S. Pat. No. 5,225,032; in this process vaporizable silanes such as methyl silane (($CH_3$) $SiH_3$) or hexamethyl disilane ($Si_2(CH_3)_6$) are used as precursors and Ar and $H_2$ or Ar/$H_2$ mixtures as carrier gases. The films are deposited on variously oriented Si substrates and on 6H—SiC ($\alpha$-SiC) at temperatures between 700 and 1300° C. under atmospheric or slightly reduced pressure. The degree of crystallinity shown by the films depends, among other things, on the substrate used, the temperature, the composition of the atmosphere as well as on the vaporizable doping additive (e.g. trimethylalane $Al(CH_3)_3$) (Appl.Phys.Lett. 61, 17 (1992) 2081–83).

Compared to other CVD processes, this process has the advantage that the silanes methyl silane and hexamethyl disilane, which are easier to handle, are used as precursors for the deposition of the SiC films. However, here too, as in all CVD processes, the formation of single-crystal films is complicated and expensive.

Sumakeris et al. (Thin Solid Films 225 (1993) 219–224) describe a modified version of this type of CVD strategy, in which single-crystal SiC films are formed on Si substrates through use of a so-called ALE (Atomic Layer Epitaxy) process. To this end the substrate is exposed in a multi-stage process and at a sample temperature of 820 to 980° C. to a quantity of $Si_2H_6$ which corresponds to a unimolecular silicon film; it is then flushed with $H_2$ before being exposed to an excess of $C_2H_4$. The sample is subsequently flushed once more with $H_2$, at the same time being exposed to a heat source of 1450 to 1700° C., which is necessary for formation of the single-crystal. The aforementioned application of a buffer layer of carbon is rendered unnecessary in this process.

Another approach to obtaining single-crystal SiC films is based on sublimation techniques, as described for example by Anikin et al., (Materials Science and Engineering, B11 (1992) 113–115). In this case, at temperatures between 1800 and 1900° C. and with a starting material comprising polycrystalline silicon and SiC, a single-crystal SiC film is formed under vacuum on a Si substrate.

Although single-crystal SiC films can be formed on suitable substrates by means of these CVD and sublimation techniques known from the prior art, these processes, due to their being complicated and therefore costly, are only of limited use for industrial-scale production, especially of mass-produced goods.

An alternative method of obtaining SiC is based on the pyrolysis of elementorganic polymers (precursors) such as polysilanes and polycarbosilanes. This method has been used to produce both SiC fibers (Yajima et al., Nature 261 (1976) 683 to 685) and SiC films (Chu et al., Springer Proceedings in Physics, Vol. 43, Amorphous and Crystalline Silicon Carbide and Related Materials II, Springer Publishing Company, Berlin, Heidelberg 1989, pp. 66 to 71). According to the method of Chu, substrates to be coated are dipped into a solution of pre-ceramic polmers, i.e. of polycarbosilane polymers, or a melt thereof, and the polymer subsequently pyrolyzed at temperatures in the range from 500 to 1500° C.; this results in the formation of amorphous phases and, at higher temperatures, microcrystalline phases. However, the formation of single-crystal films by means of a pyrolysis technique of this kind is not known from the prior art.

One object of the present invention was accordingly to develop a process with which single-crystal SiC films are obtained and which is distinguished from methods known from the prior art by being less complicated and thus economically more efficient.

The subject matter of the invention also includes a method of forming a single-crystal SiC film which contains doping additives in concentrations within a predetermined concentration range.

In addition, the subject matter of this invention also includes a single-crystal SiC film obtainable using the method of the invention, and a solid body coated therewith, respectively.

The object of the invention is established by means of a process for the formation of single-crystal epitaxial SiC films, which is characterized in that the substrate to be coated is covered with at least one carbonaceous polysilane, the adhering film then being pyrolyzed in an inert atmosphere at about 200 to 1100° C. and the ceramic layer of amorphous SiC thus obtained being crystallized by maintaining it at a temperature of over 700° C.

Surprisingly, it was found that the amorphous SiC obtained by means of pyrolysis can be transformed into single-crystal SiC by maintaining it for a suitable length of time at a sufficiently high temperature.

Generally speaking, all materials which are compatible with single-crystal SiC films serve as suitable substrates for coating according to the method of the invention. Especially in respect of technical applications, preference is given to SiC single crystals, to silicon wafers and to single-crystal $Al_2O_3$, for example sapphires. If desired, these substrates may also contain dopants.

As suitable precursor polymers use can generally be made of all carbonaceous polysilanes and polycarbosilanes and mixtures thereof which, when pyrolyzed under suitable conditions, form SiC. Suitable polymers, monomers and reaction paths are described in the general article by Laine and Babonneau (Chem. Mater. 5 (1993) 260 to 279), the disclosure of which is included here by way of reference. Currently preferred polymers include polyvinyl silanes and, in particular, polymethylvinyl silane.

The carbonaceous polysilanes are applied to the substrate through use of conventional methods which are familiar to a person skilled in the art. When a solid-phase is applied, for example a powder coating, it is preferred to maintain the coated substrate subsequently for a sufficient length of time at a temperature above the melting point of the carbonaceous polysilane. This causes the solid phase to melt, resulting in a uniform film. It is preferable, however, to apply the carbonaceous polysilane from a liquid phase, i.e. from a solution or a melt, depending on the properties of the material used. Suitable solvents include all solvents in which the polymer is soluble and which do not impair the subsequent steps of the process. Typical examples of suitable solvents are toluene, hexane, xylene etc.

It has proved to be of particular advantage if the application of the film is performed in such a way that the substrate to be coated is dipped into a solution of the polymer, or into the molten polymer. In this way it is possible, by suitably adjusting the viscosity of the solution or melt, the speed at which the substrate is withdrawn from the solution or melt, and the temperature, to regulate the thickness of the film adhering to the substrate and thus of the single-crystal SiC film obtained subsequently in an advantageous manner.

Once the polymer film has been applied, the coated substrate is exposed for a sufficient length of time—in an inert atmosphere such as a He, Ar or $N_2$ atmosphere—to a temperature which is high enough to thermally transform the adhering precursor film into a ceramic layer of amorphous SiC. The temperature range used for pyrolysis begins at a temperature of about 200° C., since decomposition can already be observed during the polymer's cross-linking phase. In general, however, higher temperatures are used for pyrolysis, for example from about 500° C. to 1100° C., preferably from 900° C. to 1100° C. The time required depends on various factors, such as the type of precursor used, the thickness of the film, and the temperature. Generally, between about 0.5 and 20 hours are needed. The course of the pyrolysis can be monitored using known techniques such as $^{13}C$ and $^{29}Si$ MAS NMR, whereby the person skilled in the art can determine suitable pyrolysis conditions for individual applications.

During the next stage of the process the amorphous SiC layer is transformed into single-crystal SiC by maintaining the sample at a suitable temperature for a sufficient length of time. The amorphous layer begins to crystallize as from about 700° C., depending on the precursor used. In other cases, however, it may be of advantage or even necessary to use higher temperatures, for example from about 1100° C. to 1600° C., or more than 1600° C. Suitable conditions for the application in question can be determined by a person skilled in the art according to known techniques, e.g. by analyzing the TEM electron diffraction.

The subject matter of this invention also includes the formation of SiC films which contain a doping additive and element, respectively. Suitable doping additives are known to a person skilled in the art and include, for example, boron as a p-type dopant and nitrogen or phosphorus as n-type dopants. In the process of the invention it is of advantage to introduce these doping additives selectively during synthesis of the precursors, so that homogeneous element distributions are obtained at atomic level as early as the pre-ceramic stage. Boron, for example, can be introduced by way of hydroboration of polyvinyl silanes, as described by Riedel et al., (Journal of Material Science 28 (1993) 3931 to 3938). Polysilazanes can be used analogously for the introduction of nitrogen.

For the formation of doped SiC films, use is accordingly made as precursor of a polymer which contains the desired dopant—in a concentration within the specified range—in the molecule. Alternatively, use can also be made of mixtures consisting of suitable proportions of a dopant-containing precursor and a non-modified precursor. It is an advantage of the method of the invention for the formation of doped SiC films that by incorporating the dopants in the precursors it is easy to keep within narrow, predetermined concentration ranges. In addition, one obtains a homogeneous element distribution.

Coated substrates according to the present invention, i.e. solid bodies which are coated with a single-crystal SiC film according to the method of the invention, comprise a film of this kind on at least part of the surface thereof. It goes without saying that one or more surfaces—for the most part planar—can be completely or partially coated with single-crystal SiC.

For a person skilled in the art it is obvious that by suitable implementation of the method according to the invention, a number of layers can be applied successively to a substrate, these layers if necessary containing different dopants. Likewise, by applying a particular layer suitably, the concentration of doping additive within the layer in question can be varied. The process of the invention thus constitutes an efficient new method of producing single-crystal epitaxial layers or films of pure and doped silicon carbide, and is economically superior to methods known from the prior art due to its simplicity. Solid bodies with an epitaxial single-crystal SiC film according to the invention have a large number of uses, in particular in the field of electronics.

The following examples, in conjunction with FIG. 1, serve to explain the invention in more detail. FIG. 1 is a schematic representation of the dip-coating process.

EXAMPLE 1
Synthesis of Polyvinyl Silane 154.03 g (6.7 mol) sodium and a mixture of 1200 ml toluene and 50 ml tetrahydrofuran are introduced into a 1000 ml three-necked flask with a reflux condenser, precision-glass stirrer and drip funnel. At a temperature of 100° C. a mixture of 104.1 ml (115.04 g; 1.0 mol) dichloromethyl silane, 121.3 ml (129.06 g; 1.0 mol) of dichlorodimethyl silane, 130.62 ml (141.07 g; 1.0 mol) dichloromethylvinyl silane and 88.8 ml (76.05 g; 0.7 mol) chlorotrimethyl silane are added dropwise to the contents of the flask. The reaction mixture is refluxed for 8 hours. The soluble polyvinyl silanes are separated from the insoluble ones by means of a protective-gas frit. The insoluble PVS component, with its higher molecular weight, is obtained by elutriation of the salt followed by drying under vacuum. In this reaction one obtains a 120 g (52% yield) soluble component and 90 g (38%) insoluble PVS polymer.

EXAMPLE 2
Formation of Single-Crystal Epitaxial SiC Films on Single Crystals of SiC In order to apply the synthesized polymethylvinyl silane to the substrate, it was first of all dissolved in toluene. The polysilane content of the solution was 15.9 wt. %. The measured viscosity was 1.3 mPa.s, the density 0.87 g/cm³. As shown in FIG. 1, a substrate made of single-crystal SiC was dipped into this solution and then withdrawn again at a constant speed.

The polymer film adhering to the substrate was then pyrolyzed in an argon atmosphere at 1000° C. The resulting film consisted of amorphous SiC, as could be shown by means of electron diffraction in a transmission electron microscope (TEM). In a subsequent step this coated substrate was aged in a graphite oven at 1600° C. for a period of 10 h and then examined by means of TEM electron diffraction. The diffraction pattern showed that the film on the age-hardened substrate was monocrystalline. The film was about 300 nm thick.

We claim:

1. A process for the formation of single crystal, epitaxial SiC films, comprising:

covering a substrate with a coat of at least one carbonaceous polysilane to form an adhering film which is then pyrolyzed in a protective-gas atmosphere at about 200° C. to 1100° C. to form ceramic layer of amorphus SiC which is then crystallized by maintaining it at a temperature of over 700° C.

2. The process of claim 1, further comprising regulating thickness of said adhering film by adjusting viscosity of said solution or melt, speed at which said substrate is withdrawn from said solution or melt, and said temperature.

3. The process of claim 1, comprising using a polysilane or polycarbosilane as carbonaceous polysilane.

4. The process of claim 3, further comprising forming a doped SiC film by adding to said solution or melt either a compound of the dopant with a silane compound or a polysilane which contains said dopant within said molecule.

5. The process of claim 4, further comprising adding hydroborated polyvinyl silane to obtain a boron-doped SiC film.

6. The process of claim 4, further comprising adding a polysilazane to obtain an n-doped SiC film.

7. The process of claim 1 comprising carrying out pyrolysis at a temperature of from 900° C. to 1100° C.

8. The process of claim 1 comprising carrying out crystallization at a temperature of about 1100° C. to 1600° C.

9. A single-crystal epitaxial SiC film, obtained by covering a substrate to be coated with at least one carbonaceous polysilane, pyrolyzing the adhering layer at about 200° C. to 1100° C. in a protective-gas atmosphere and crystallizing the thus-obtained ceramic layer of amorphous SiC by maintaining it at a temperature of over 700° C.

10. A solid body which is coated with at least one layer of single-crystal SiC, obtained by applying at least one carbonaceous polysilane to at least part of the surface of the solid body, pyrolyzing the adhering layer at about 200° C. to 1100° C. in a protective-gas atmosphere and crystallizing the thus-obtained ceramic layer of amorphous SiC by maintaining it at a temperature of over 700° C.

* * * * *

UNITED STATES PATENT AND TRADEMARK OFFICE
CERTIFICATE OF CORRECTION

PATENT NO. : 6,117,233
DATED : Sep. 12, 2000
INVENTOR(S) : Bill et al.

It is certified that error appears in the above-identified patent and that said Letters Patent is hereby corrected as shown below:

In claim 1, line 2, change "covering" to - - coating - -.
In claim 1, line 4, after "form" insert - - a - -.
In claim 1, line 5-6, after "C" insert - - wherein said substrate is coated by dipping said substrate into a solution of said carbonaceous polysilane or a melt thereof. - -.

Signed and Sealed this

Twenty-fourth Day of April, 2001

Attest:

NICHOLAS P. GODICI

Attesting Officer

Acting Director of the United States Patent and Trademark Office